(12) United States Patent
Wu et al.

(10) Patent No.: US 11,069,556 B2
(45) Date of Patent: Jul. 20, 2021

(54) MICRO COMPONENT STRUCTURE

(71) Applicant: PlayNitride Display Co., Ltd., MiaoLi County (TW)

(72) Inventors: Bo-Wei Wu, MiaoLi County (TW); Yu-Yun Lo, MiaoLi County (TW); Shiang-Ning Yang, MiaoLi County (TW); Ying-Ting Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 16/842,790

(22) Filed: Apr. 8, 2020

(65) Prior Publication Data
US 2021/0166966 A1   Jun. 3, 2021

(30) Foreign Application Priority Data

Dec. 3, 2019   (TW) ................................. 108144007

(51) Int. Cl.
*H01L 21/683*   (2006.01)

(52) U.S. Cl.
CPC   *H01L 21/6835* (2013.01); *H01L 2221/68381* (2013.01)

(58) Field of Classification Search
CPC .................. H01L 21/6835; H01L 2221/68381
USPC ....................................................... 257/798
See application file for complete search history.

(56) References Cited

U.S. PATENT DOCUMENTS

| | | | |
|---|---|---|---|
| 7,426,117 B2* | 9/2008 | Van Schuylenbergh | ..................... H01L 23/22 257/E23.063 |
| 10,486,962 B2* | 11/2019 | Tseng | ..................... G01L 1/148 |
| 2006/0145321 A1* | 7/2006 | Fisher | ..................... G02B 7/026 257/678 |
| 2017/0352646 A1 | 12/2017 | Bower et al. | |
| 2019/0363000 A1 | 11/2019 | Wu et al. | |

FOREIGN PATENT DOCUMENTS

| | | |
|---|---|---|
| TW | 201929187 | 7/2019 |
| TW | 201929188 | 7/2019 |

OTHER PUBLICATIONS

"Office Action of Taiwan Counterpart Application", dated Sep. 2, 2020, p. 1-p. 4.

* cited by examiner

*Primary Examiner* — Vu A Vu
(74) *Attorney, Agent, or Firm* — JCIPRNET

(57) ABSTRACT

A micro component structure includes a substrate, at least one micro component and a fixing structure. The micro component is disposed on the substrate, has a spacing from the substrate and has at least one top surface. The fixing structure is disposed on the substrate and includes at least one covering portion and at least one connecting portion. The covering portion is disposed on a portion of the top surface of the micro component, and the connecting portion is connected to an edge of the covering portion and extends onto the substrate. At least one of the covering portion and the connecting portion includes at least one patterned structure.

8 Claims, 11 Drawing Sheets

MICRO COMPONENT STRUCTURE

CROSS REFERENCE TO RELATED APPLICATION

This application claims the priority benefit of Taiwan application serial no. 108144007, filed on Dec. 3, 2019. The entirety of the above-mentioned patent application is hereby incorporated by reference herein and made a part of specification.

BACKGROUND OF THE INVENTION

Field of the Invention

The disclosure relates to a semiconductor structure, and in particular relates to a micro component structure.

Description of Related Art

At present, the transfer of a micro light emitting diode (LED) is mainly performed through electrostatic force or magnetic force to transfer the micro LED on a carrier substrate onto a receiving substrate. In general, the micro LED is held by a fixing structure to enable the micro LED to be easily taken from the carrier substrate and transported and transferred onto the receiving substrate, and the fixing structure is configured to fix the micro LED to prevent the quality of the micro LED from being affected by other external factors during transfer. However, because the size of the micro LED is changed and the density of the micro LED is increased, the manufacturing difficulty of the fixing structure is increased. Furthermore, the area and shape of a contact surface between the fixing structure and the micro LED will affect the yield of the micro LED during transportation and transfer. Therefore, how to enable the fixing structure to temporarily hold the micro LED and more easily and efficiently transport and transfer the micro LED between the carrier substrate and the receiving substrate has become one of the issues that attract attention in the industry at present.

SUMMARY OF THE INVENTION

The invention is directed to a micro component structure. A bonding strength between a fixing structure and a micro component may be adjusted by virtue of a design of a patterned structure, and a structural yield may be improved.

A micro component structure of the invention includes a substrate, at least one micro component and a fixing structure. The micro component is disposed on the substrate, has a spacing from the substrate and has at least one top surface. The fixing structure is disposed on the substrate and includes at least one covering portion and at least one connecting portion. The covering portion is disposed on a portion of the top surface of the micro component, and the connecting portion is connected to an edge of the covering portion and extends onto the substrate. At least one of the covering portion and the connecting portion includes at least one patterned structure.

In an embodiment of the invention, the at least one patterned structure is at least one groove, and the connecting portion includes the groove.

In an embodiment of the invention, a ratio of a depth of the groove to a thickness of a fixing structure is greater than or equal to 0.5 and less than 1.

In an embodiment of the invention, from a top view, a width ratio of a groove to a connecting portion along a cutting line is greater than or equal to 0.2 and less than or equal to 0.8, and a ratio of an area of the connecting portion occupied by the groove to an area of the connecting portion is greater than or equal to 0.2 and less than or equal to 0.8.

In an embodiment of the invention, an orthogonal projection of the groove on a substrate is not overlapped with an orthogonal projection of a micro component on the substrate.

In an embodiment of the invention, the at least one connecting portion includes a plurality of connecting portions, and the at least one groove includes a plurality of grooves. The covering portion is connected to the connecting portions respectively, and the connecting portions are dispersed from each other and are arranged symmetrically.

In an embodiment of the invention, the at least one patterned structure is at least one opening, and a connecting portion includes the opening.

In an embodiment of the invention, from a top view, a ratio of an area of a connecting portion occupied by an opening to an area of the connecting portion is greater than or equal to 0.2 and less than or equal to 0.8, and a width ratio of the opening to the connecting portion along a cutting line is greater than or equal to 0.2 and less than or equal to 0.8.

In an embodiment of the invention, an orthogonal projection of the opening on a substrate is not overlapped with an orthogonal projection of a micro component on the substrate.

In an embodiment of the invention, the at least one connecting portion includes a first connecting portion and a second connecting portion. From a top view, the first connecting portion and the second connecting portion are respectively located at a diagonal line of a micro component. A width of the second connecting portion is greater than a width of the first connecting portion.

In an embodiment of the invention, the at least one opening includes a plurality of first openings and a plurality of second openings. The first connecting portion includes the first openings, and the second connecting portion includes the second openings. A ratio of an area of the second connecting portion occupied by the second openings to an area of the second connecting portion is less than a ratio of an area of the first connecting portion occupied by the first openings to an area of the first connecting portion.

In an embodiment of the invention, the at least one connecting portion includes a plurality of connecting portions, and the at least one opening includes a plurality of openings. Covering portions are connected to the connecting portions respectively, and the connecting portions are dispersed from each other and are arranged symmetrically.

In an embodiment of the invention, the at least one opening includes a plurality of openings, and a density of the openings gradually decreases in a direction from being close to a micro component to being away from the micro component.

In an embodiment of the invention, the at least one opening includes a plurality of openings, and apertures of the openings gradually decrease in a direction from being close to a micro component to being away from the micro component.

In an embodiment of the invention, a shortest distance between the opening closest to the micro component and the micro component is less than a shortest distance between the opening and a substrate.

In an embodiment of the invention, the at least one micro component includes a plurality of micro components. A fixing structure further includes at least one contact portion, and the contact portion is located among the micro components and is in direct contact with a substrate.

In an embodiment of the invention, the at least one covering portion includes a plurality of covering portions, the at least one top surface includes a plurality of top surfaces, and the covering portions are located on the top surfaces respectively. The at least one patterned structure includes a plurality of openings, and the connecting portion is connected to the covering portions and includes the openings. A ratio of an area of the connecting portion occupied by the openings is greater than or equal to 0.8 and less than 1.

In an embodiment of the invention, a ratio of an orthogonal projection area of each covering portion on a top surface of a corresponding micro component to an area of the top surface of the micro component is greater than or equal to 0.5 and less than or equal to 1.

In an embodiment of the invention, the covering portions and the connecting portions include openings. A ratio of an area of each covering portion occupied by the openings to an area of each covering portion is greater than or equal to 0.8 and less than 1.

Based on the above, in a design of a micro component structure of the invention, at least one of a covering portion and a connecting portion of a fixing structure includes a patterned structure, so that by virtue of the design, a bonding strength between a micro component and the fixing structure may be adjusted, and a transfer yield of the micro component structure may be improved.

In order to make the above features and advantages of the invention more obvious and comprehensible, embodiments accompanied with drawings are described in detail below.

DESCRIPTION OF THE EMBODIMENTS

Embodiments of the invention describe a structure of a micro component (such as a micro light emitting diode (micro LED) or a micro chip), so as to be taken and transferred onto a receiving substrate. The receiving substrate may be a display substrate, a light emitting substrate, substrates having functional components such as transistors or Integrated Circuits (ICs), or other substrates having lines, but is not limited thereto. Although some embodiments of the invention specifically describe micro LEDs including p-n diodes, it should be understood that the embodiments of the invention are not limited thereto. Some embodiments may also be applied to other micro components, and by virtue of the mode, the components are designed to control the execution of preset electronic functions (such as diodes, transistors and ICs) or photon functions (LEDs and lasers).

Figure 1:
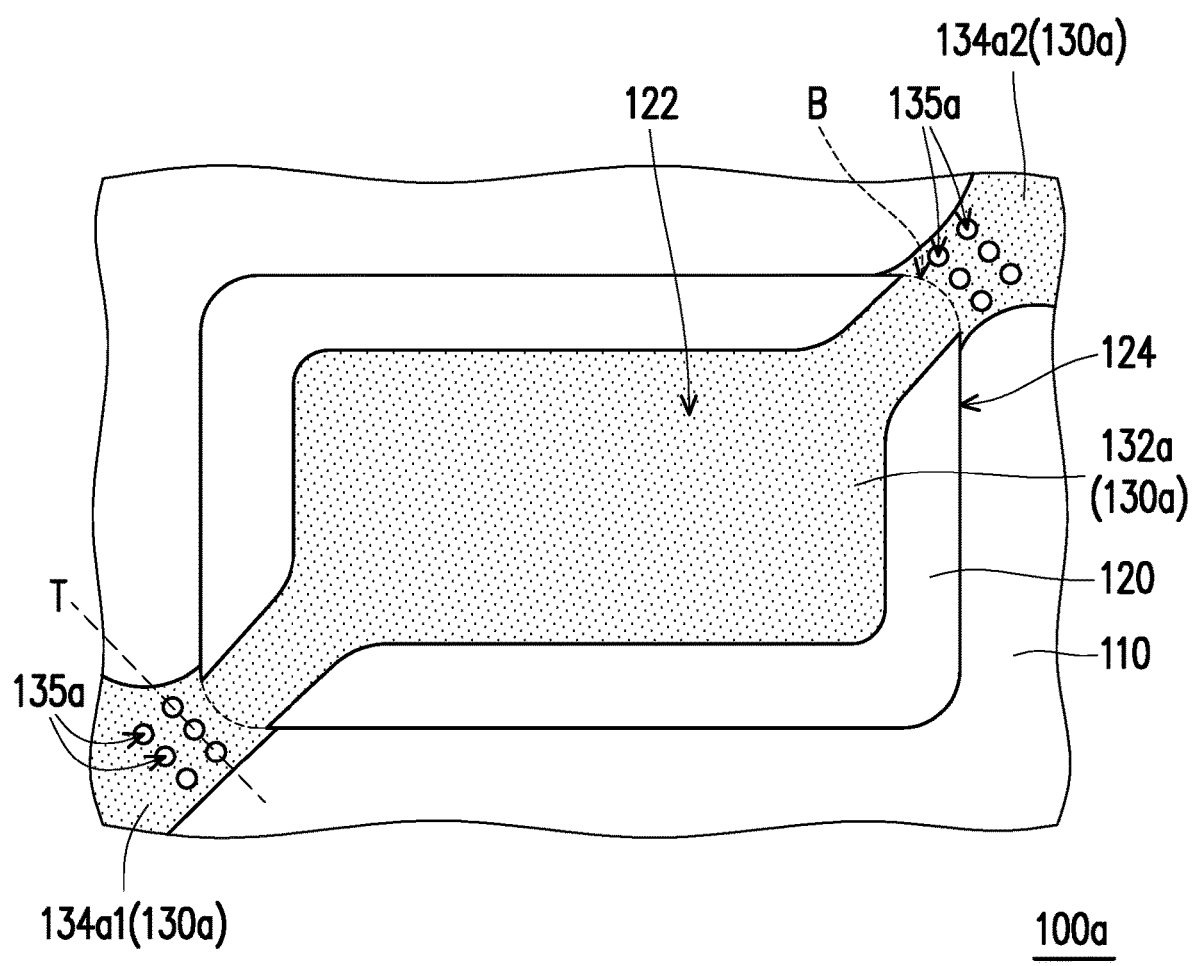
FIG. 1 is a schematic top diagram of a micro component structure according to an embodiment of the invention.

FIG. 1 is a schematic top diagram of a micro component structure according to an embodiment of the invention. Referring to FIG. 1, in the present embodiment, a micro component structure 100a includes a substrate 110, at least one micro component (a micro component 120 is schematically shown) and a fixing structure 130a. The micro component 120 is disposed on the substrate 110 and has at least one top surface (a top surface 122 is schematically shown), wherein a micro component 120a has a spacing from the substrate 110. Here, an air spacing exists between the micro component 120a and the substrate 110 to adjust the transfer force for subsequent transfer. The fixing structure 130a is disposed on the substrate 110 and includes at least one covering portion (a covering portion 132a is schematically shown) and at least one connecting portion (two connecting portions 134a1 and 134a2 are schematically shown). The covering portion 132a covers a portion of the top surface 122 of the micro component 120, and the connecting portions 134a1 and 134a2 are connected to an edge of the covering portion 132a and extend onto the substrate 110. At least one of the covering portion 132a and the connecting portions 134a1 and 134a2 include at least one patterned structure (a plurality of patterned structures 135a are schematically shown).

In detail, in the present embodiment, the substrate 110 may be a temporary substrate, such as a plastic substrate, a glass substrate, a sapphire substrate or other substrates having fixing properties and flat surfaces, but is not limited in the invention. In the embodiment as shown in FIG. 1, the number of the micro component 120 is one, but is not limited in the invention. In other embodiments, a plurality of micro components 120 may be disposed. A maximum size of the micro component 120 is less than or equal to 100 micrometers. Preferably, a maximum size of the micro component 120 is less than or equal to 50 micrometers, which is more suitable for a micro LED display technology using micro LEDs as pixels. In other embodiments, the micro component 140 may be a micro Integrated Circuit (micro IC), a micro Laser Diode (micro LD) or a micro sensor, but is not limited in the invention. The material of the fixing structure 130 may be silicon dioxide, silicon nitride, Silicon Oxide Glass (SOG), other suitable inorganic materials, or conductive materials. The fixing structure 130 remaining on a surface of the micro component 120 after subsequent transfer may be used as an electrode of a vertical micro component or may be used as a common electrode, which is not limited herein.

Furthermore, as shown in FIG. 1, the connecting portions 134a1 and 134a2 in the present embodiment are respectively located at a diagonal line of the micro component 120, and the connecting portions 134a1 and 134a2 include patterned structures 135a. Specifically, the patterned structures 135a are openings penetrating through the connecting portions 134a1 and 134a2, and a ratio of areas of the connecting portions 134a1 and 134a2 occupied by the openings to areas of the connecting portions 134a1 and 134a2 is greater than or equal to 0.2 and less than or equal to 0.8. If the ratio is greater than 0.8, the support force of the connecting portions 134a1 and 134a2 is insufficient; and if the ratio is less than 0.2, the connecting portions 134a1 and 134a2 are not easy to break. Here, the openings may be circular. Of course, in other embodiments, the openings may also be oval or polygonal and are not limited herein. Here, orthogonal projections of the patterned structures 135a (openings) on the substrate 110 are not overlapped with an orthogonal projection of the micro component 120 on the substrate 110. In other words, the covering portion 132a covering the top surface 122 of the micro component 120 is of an integral structure, is not provided with any patterned structure 135a (opening), and may have a good connection force. Furthermore, the patterned structures 135a are only disposed on the connecting portions 134a1 and 134a2, so that the fixing structure does not remain on the micro component 120 after subsequent transfer. Furthermore, from a top view, a width ratio of the openings to the connecting portions 134a1 and 134a2 along a cutting line T is greater than or equal to 0.2 and less than or equal to 0.8. If the ratio is greater than 0.8, the support force of the connecting portions 134a1 and 134a2 is insufficient; and if the ratio is less than 0.2, the connecting portions 134a1 and 134a2 are not easy to break. An opening width described herein is a sum of widths of all openings, and a width of a single opening may be between 0.2 and 0.8 and is not limited herein.

When the micro component 120 is taken from the substrate 110, a taking stress (such as a pressing force or a pull-up force) may cause the fixing structure 130a to break. Because the connecting portions 134a1 and 134a2 of the fixing structure 130a include the patterned structures 135a (openings), a breaking point of the fixing structure 130a may be close to or substantially located at a junction B of the top surface 122 of the micro component 120 and a surrounding surface 124. Therefore, the problem of incomplete breakage or remaining of the fixing structure 130a may be reduced, and the yield of the micro component 120 during transportation and transfer to a subsequent circuit substrate (not shown) may be improved. In brief, the bonding strength between the micro component 120 and the fixing structure 130a is adjusted by means of the layout of the patterned structures 135a (openings), and thus, the structural yield of the micro component structure 100a may be improved.

It should be noted that the following embodiments follow the component symbols and partial contents of the above embodiments, same symbols are adopted to represent same or similar components, and the descriptions of the same technical contents are omitted. The descriptions of the omitted portions may refer to the above embodiments, and the descriptions are omitted in the following embodiments.

Figure 2:
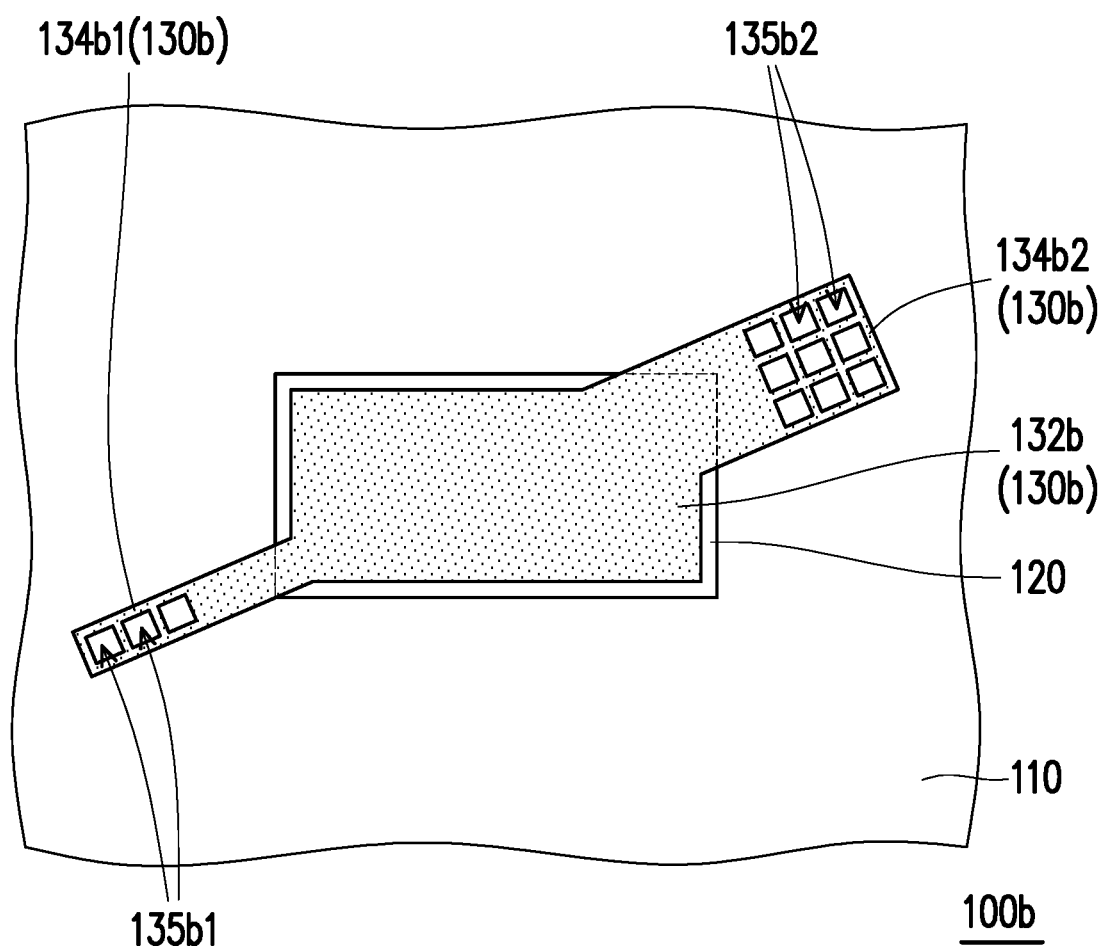
FIG. 2 is a schematic top diagram of a micro component structure according to another embodiment of the invention.

FIG. 2 is a schematic top diagram of a micro component structure according to another embodiment of the invention. Simultaneously referring to FIG. 1 and FIG. 2, a micro component structure 100b of the present embodiment is similar to the micro component structure 100a in FIG. 1, and the difference between the micro component structure 100b and the micro component structure 100a is as follows: a fixing structure 130b of the present embodiment includes a covering portion 132b and connecting portions 134b1 and 134b2 (regarded as a first connecting portion and a second connecting portion), wherein a width of the connecting portion 134b2 is greater than a width of the connecting portion 134b1. That is, the connecting portions 134b1 and 134b2 are of an asymmetric structure. When the weight of the micro component 120 is asymmetric, the fixing structure 130b having the asymmetric structure may be configured to stabilize the overall micro component structure 100b. Here, a ratio of an area of the connecting portion 134b2 occupied by patterned structures 135b2 (regarded as second openings) to an area of the connecting portion 134b2 is less than a ratio of an area of the connecting portion 134b1 occupied by patterned structures 135b1 (regarded as first openings) to an area of the connecting portion 134b1. Here, the fixing structure 130b having the asymmetric structure is configured to stabilize the overall micro component structure 100b. However, in embodiments not shown, the area ratio of the two may be the same. A breaking point falling position of the fixing structure 130b may be controlled by means of the aperture sizes, numbers and arrangement modes of the patterned structures 135b1 and 135b2. However, in embodiments not shown, the widths of the two may be the same. A breaking point falling position of the fixing structure 130b may be controlled by means of the areas, aperture sizes, numbers and arrangement modes of the patterned structures 135b1 and 135b2.

Figure 3:
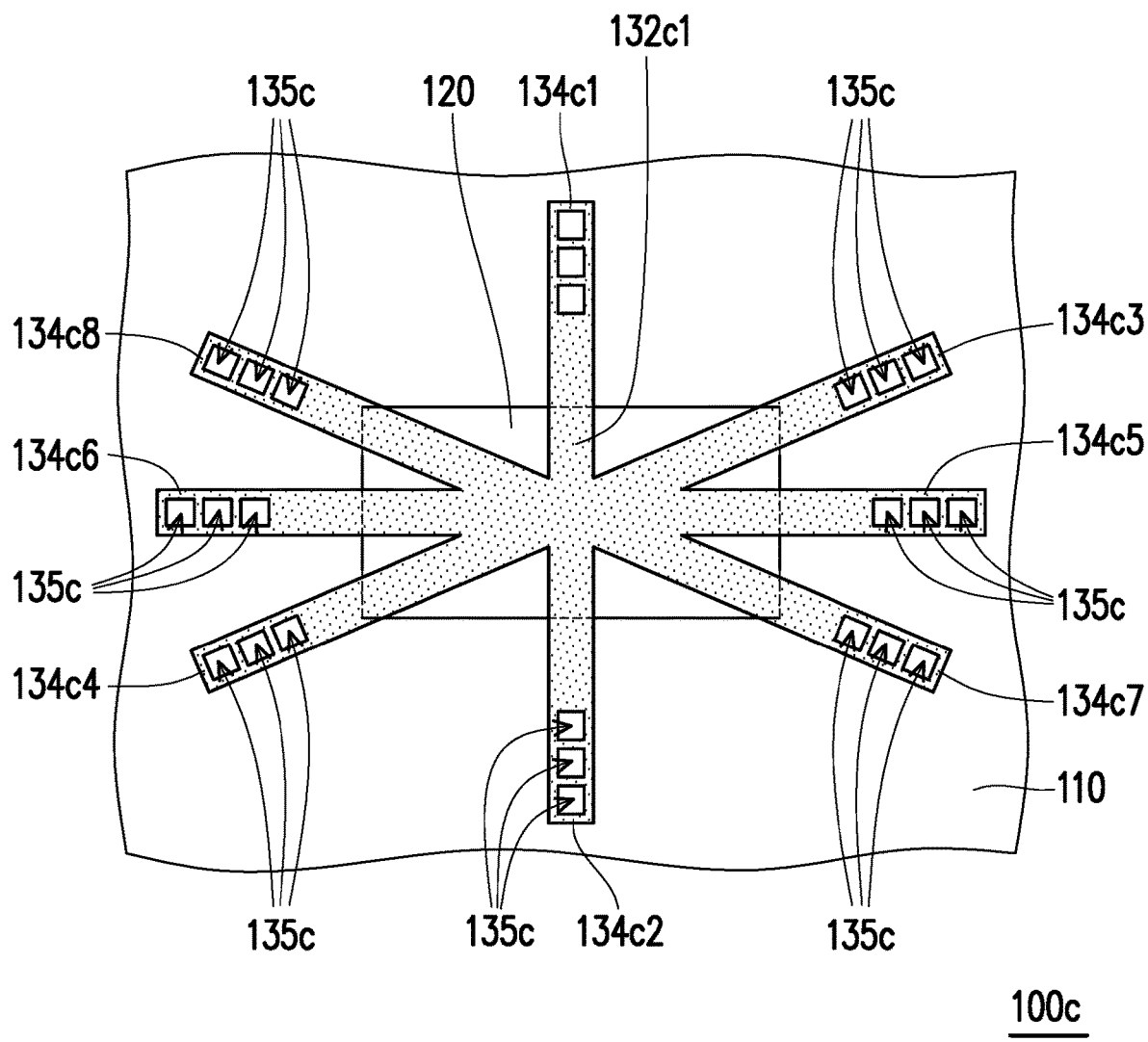
FIG. 3 is a schematic top diagram of a micro component structure according to another embodiment of the invention.

FIG. 3 is a schematic top diagram of a micro component structure according to another embodiment of the invention. Simultaneously referring to FIG. 1 and FIG. 3, a micro component structure 100c of the present embodiment is similar to the micro component structure 100a in FIG. 1, and the difference between the micro component structure 100c and the micro component structure 100a is as follows: a fixing structure 130c of the present embodiment includes a plurality of connecting portions 134c1, 134c2, 134c3, 134c4, 134c5, 134c6, 134c7 and 134c8. A covering portion 132c is connected to the connecting portions 134c1, 134c2, 134c3, 134c4, 134c5, 134c6, 134c7 and 134c8 respectively, and the connecting portions 134c1, 134c2, 134c3, 134c4, 134c5, 134c6, 134c7 and 134c8 are dispersed from each other and are arranged symmetrically. In a unit area, ratios of areas of the connecting portions 134c1, 134c2, 134c3, 134c4, 134c5, 134c6, 134c7 and 134c8 occupied by patterned structures 135c (openings) of each of the connecting portions 134c1, 134c2, 134c3, 134c4, 134c5, 134c6, 134c7 and 134c8 to an area of the connecting portion 134b2 are the same. Therefore, when a connecting portion (such as the connecting portion 134c1) in the fixing structure 130c is abnormal in structure, the overall fixing structure 130c has a low support influence and is not easy to incline and scatter. Eight connecting portions are shown here, but are not limited thereto. Symmetrical arrangement modes, such as point symmetry, line symmetry and diagonal arrangement, all fall within the contents of the invention.

Figure 4:
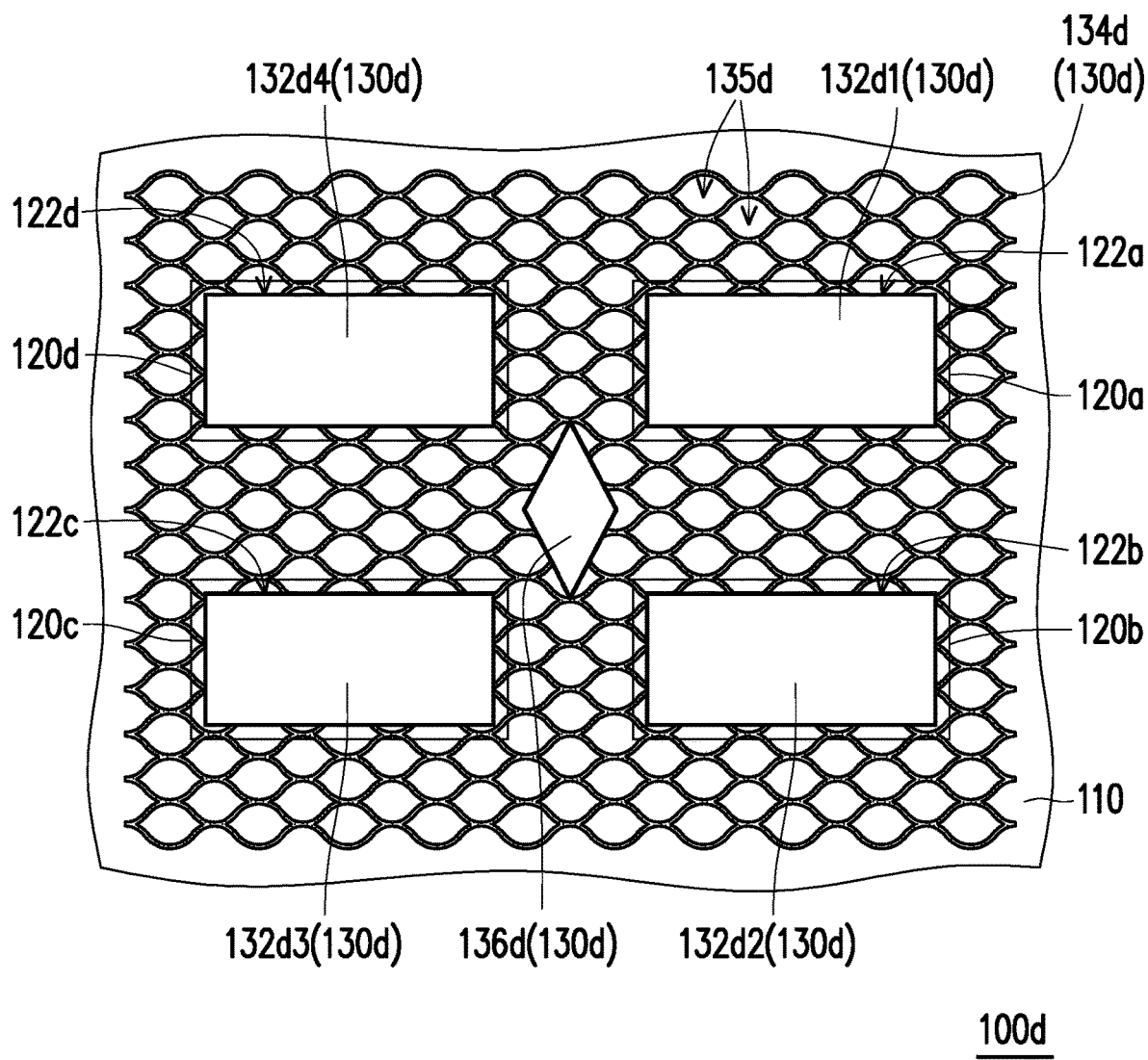
FIG. 4 is a schematic top diagram of a micro component structure according to another embodiment of the invention.

FIG. 4 is a schematic top diagram of a micro component structure according to another embodiment of the invention. Simultaneously referring to FIG. 1 and FIG. 4, a micro component structure 100d of the present embodiment is similar to the micro component structure 100a in FIG. 1, and the difference between the micro component structure 100d and the micro component structure 100a is as follows: the micro component structure 100d of the present embodiment includes a plurality of micro components 120a, 120b, 120c and 120d. A fixing structure 130d includes a plurality of covering portions 132d1, 132d2, 132d3 and 132d4, a connecting portion 134d and at least one contact portion (a contact portion 136d is schematically shown), wherein the contact portion 136d is located among the micro components 120a, 120b, 120c and 120d and is in direct contact with a substrate 110, and the connecting portion 134d encircles the micro components 120a, 120b, 120c and 120d. The covering portions 132d1, 132d2, 132d3 and 132d4 are respectively located on top surfaces 122a, 122b, 122c and 122d of the micro components 120a, 120b, 120c and 120d, and the connecting portion 134d is connected to the covering portions 132d1, 132d2, 132d3 and 132d4 and the contact portion 136d, and includes patterned structures 135d (openings). That is, the connecting portion 134d of the present embodiment is of a mesh structure, and the covering portions 132d1, 132d2, 132d3 and 132d4 are of an integral structure, are not provided with any patterned structure 135d (opening), and may have a good connection force. Here, a ratio of an orthogonal projection area of each of the covering portions 132d1, 132d2, 132d3 and 132d4 on each of the top surfaces 122a, 122b, 122c and 122d of the corresponding micro components 120a, 120b, 120c and 120d to an area of each of the top surfaces 122a, 122b, 122c and 122d of the micro components 120a, 120b, 120c and 120d is greater than or equal to 0.5 and less than or equal to 1. If the ratio is greater than or equal to 0.5 and less than or equal to 1, the covering portions 132d1, 132d2, 132d3 and 132d4 after subsequent transfer may remain on the micro components 120a, 120b, 120c and 120d as light guiding structures (not shown) so as to increase frontal light emission. Because the fixing structure 130d of the present embodiment is provided with the contact portion 136d in contact with the substrate 110 and the contact portion 136d is not provided with any patterned structure 135d (opening), a good connection force may be obtained. In an embodiment not shown, the connecting portion may also be directly connected to the substrate without the need of the contact portion, which is not limited herein.

Figure 5:
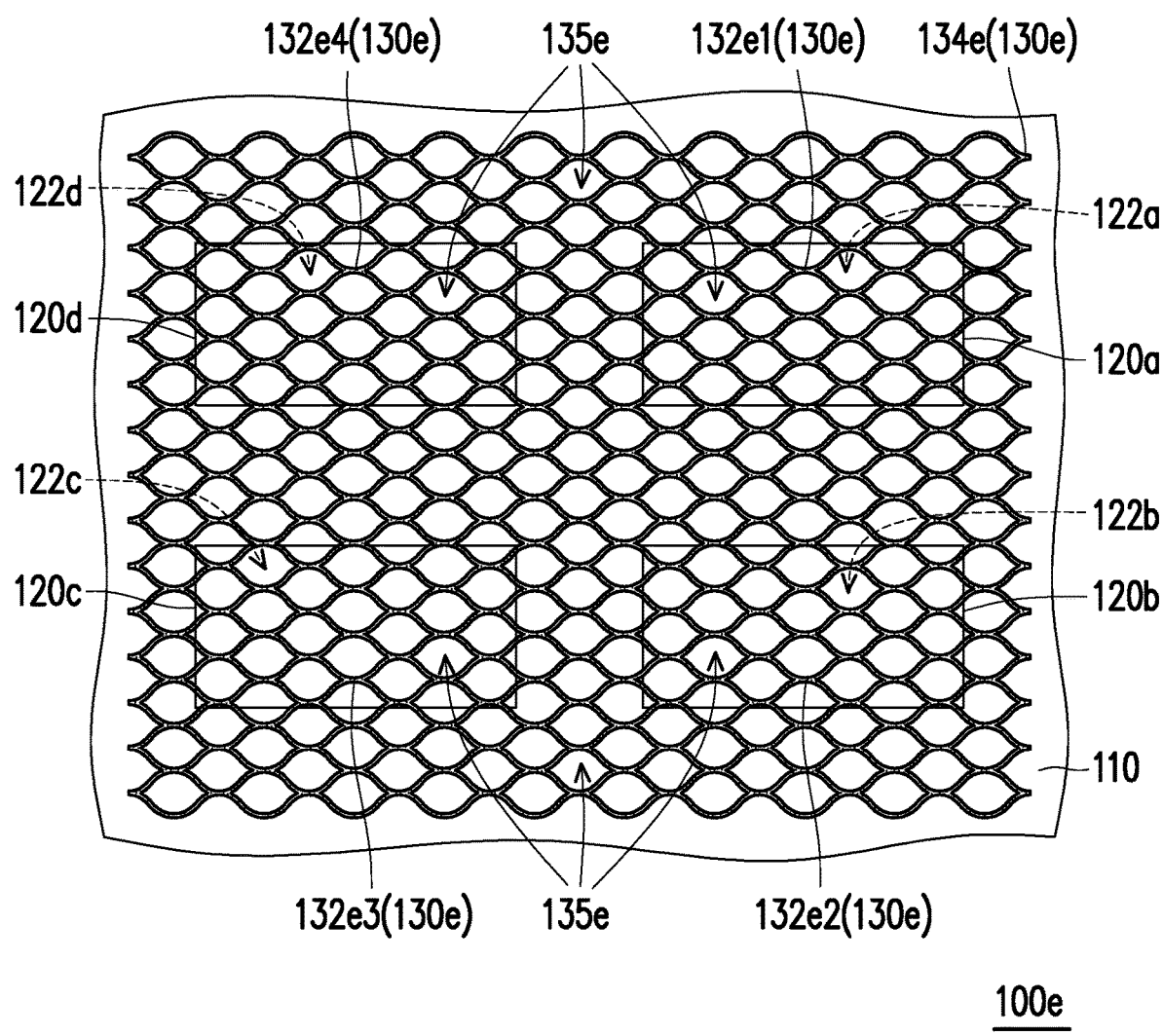
FIG. 5 is a schematic top diagram of a micro component structure according to another embodiment of the invention.

FIG. 5 is a schematic top diagram of a micro component structure according to another embodiment of the invention. Simultaneously referring to FIG. 4 and FIG. 5, a micro component structure 100e of the present embodiment is similar to the micro component structure 100d in FIG. 4, and the difference between the micro component structure 100e and the micro component structure 100d is as follows: a fixing structure 130e of the present embodiment is not provided with the contact portion 136d, and covering portions 132e1, 132e2, 132e3 and 132e4 and a connecting portion 134e include patterned structures 135e (openings). That is, the fixing structure 130e of the present embodiment is of a mesh structure. In other words, the patterned structures 135e of the covering portions 132e1, 132e2, 132e3 and 132e4 may expose portions of the top surfaces 122a, 122b, 122c and 122d of the corresponding micro components 120a, 120b, 120c and 120d. Here, a ratio of an area of each of the covering portions 132e1, 132e2, 132e3 and 132e4 occupied by the patterned structures 135e to an area of each of the covering portions 132e1, 132e2, 132e3 and 132e4 is greater than or equal to 0.8 and less than 1. If the ratio is greater than or equal to 0.8 and less than 1, when the covering portions after subsequent transfer remain on the micro component 120a, it will not affect the frontal light emission.

Figure 6:
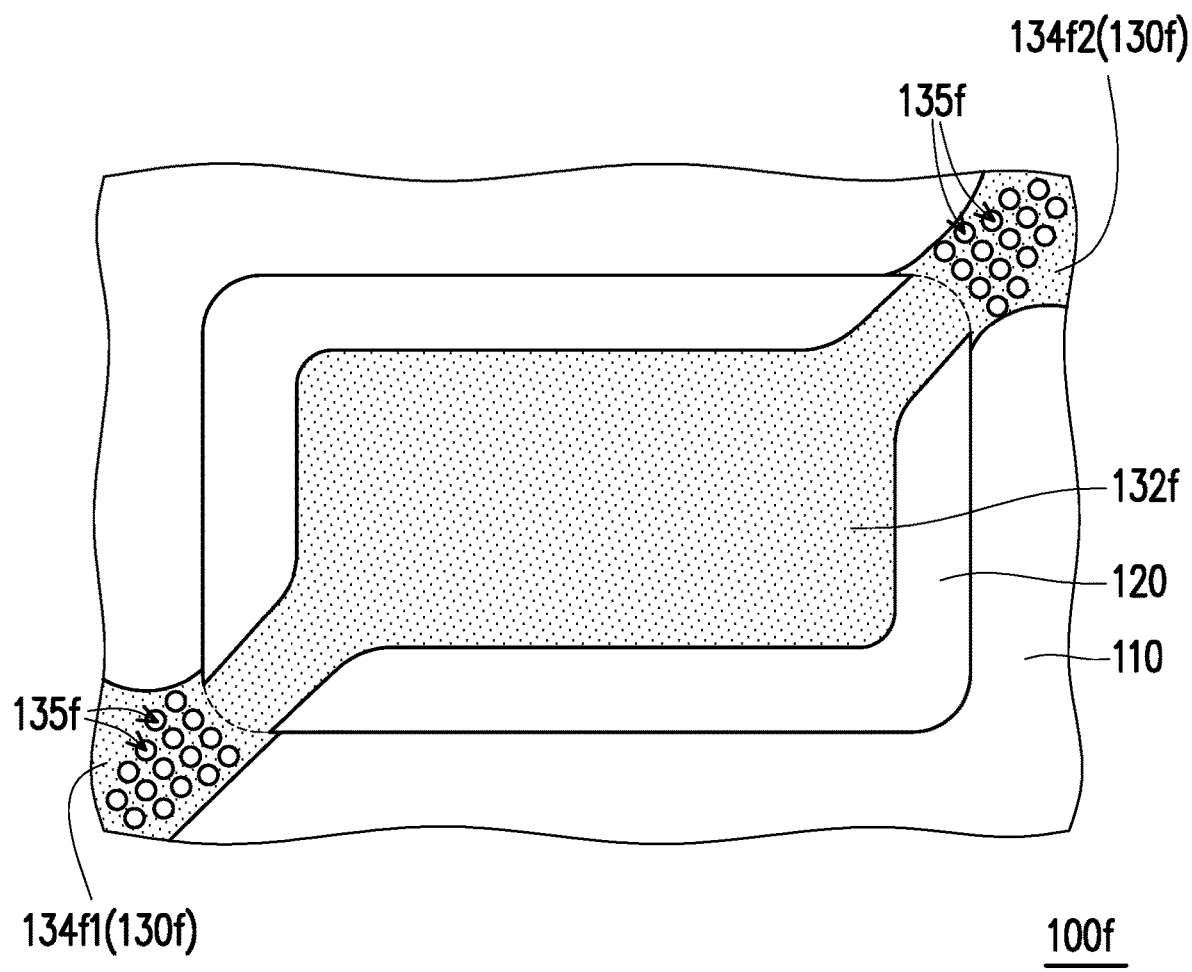
FIG. 6 is a schematic top diagram of a micro component structure according to another embodiment of the invention.

FIG. 6 is a schematic top diagram of a micro component structure according to another embodiment of the invention. Simultaneously referring to FIG. 1 and FIG. 6, a micro component structure 100f of the present embodiment is similar to the micro component structure 100a in FIG. 1, and the difference between the micro component structure 100f and the micro component structure 100a is as follows: a density of patterned structures 135f (openings) of connecting portions 134f1 and 134f2 of a fixing structure 130f of the present embodiment gradually decreases in a direction from being close to the micro component 120 to being away from the micro component 120. By virtue of the design, a breaking point may be close to a space between the connecting portions 134f1 and 134f2 and a covering portion 132f, thereby preventing the connecting portions 134f1 and 134f2 after transfer from remaining on the micro component 120, and increasing the yield of the micro component 120.

Figure 7:
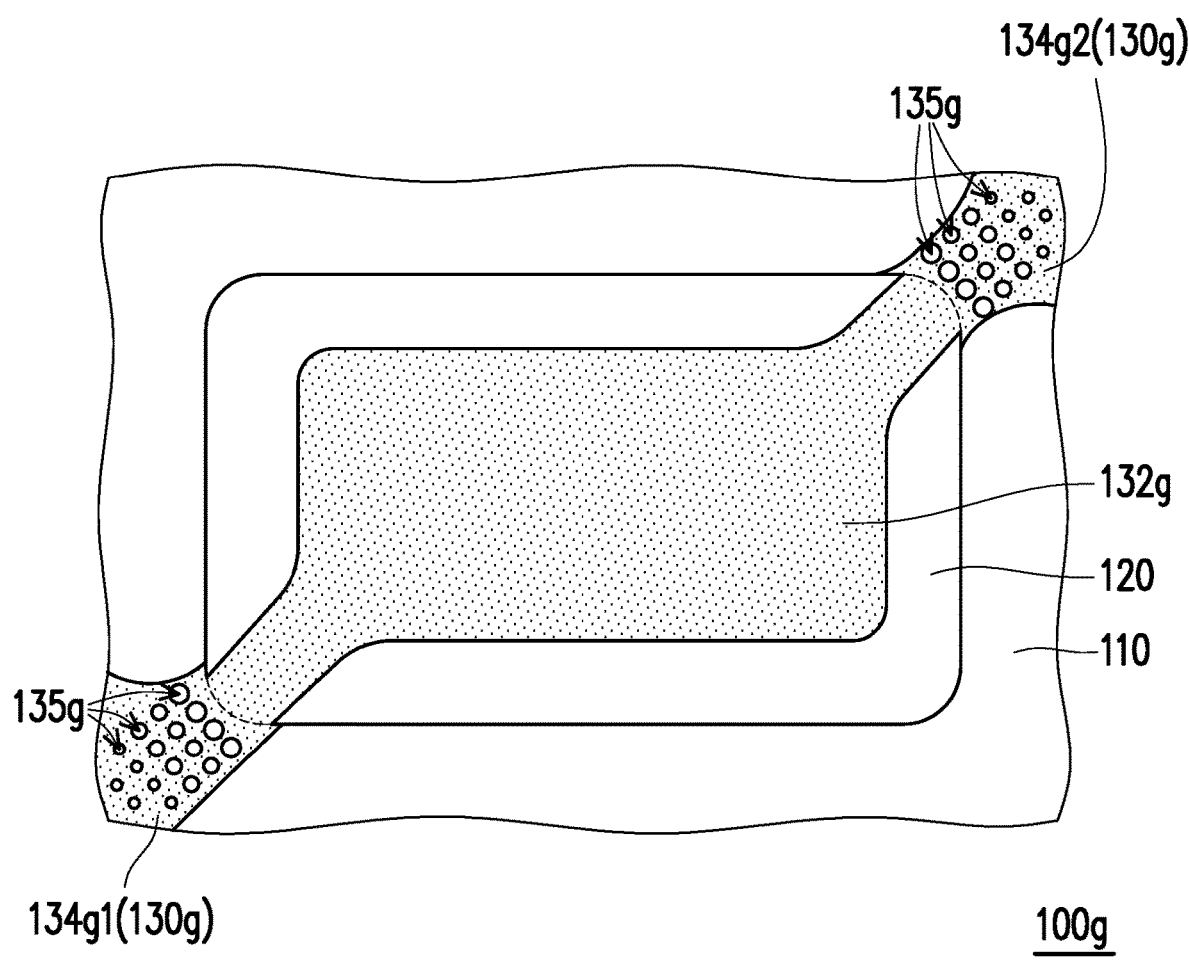
FIG. 7 is a schematic top diagram of a micro component structure according to another embodiment of the invention.

FIG. 7 is a schematic top diagram of a micro component structure according to another embodiment of the invention. Simultaneously referring to FIG. 1 and FIG. 7, a micro component structure 100g of the present embodiment is similar to the micro component structure 100a in FIG. 1, and the difference between the micro component structure 100g and the micro component structure 100a is as follows: apertures of patterned structures 135g (openings) of connecting portions 134g1 and 134g2 of a fixing structure 130g of the present embodiment gradually decrease in a direction from being close to the micro component 120 to being away from the micro component 120. By virtue of the design, a breaking point may be close to a space between the connecting portions 134g1 and 134g2 and a covering portion 132g, thereby preventing the connecting portions 134g1 and 134g2 after transfer from remaining on the micro component 120, and increasing the yield of the micro component 120.

Figure 8:
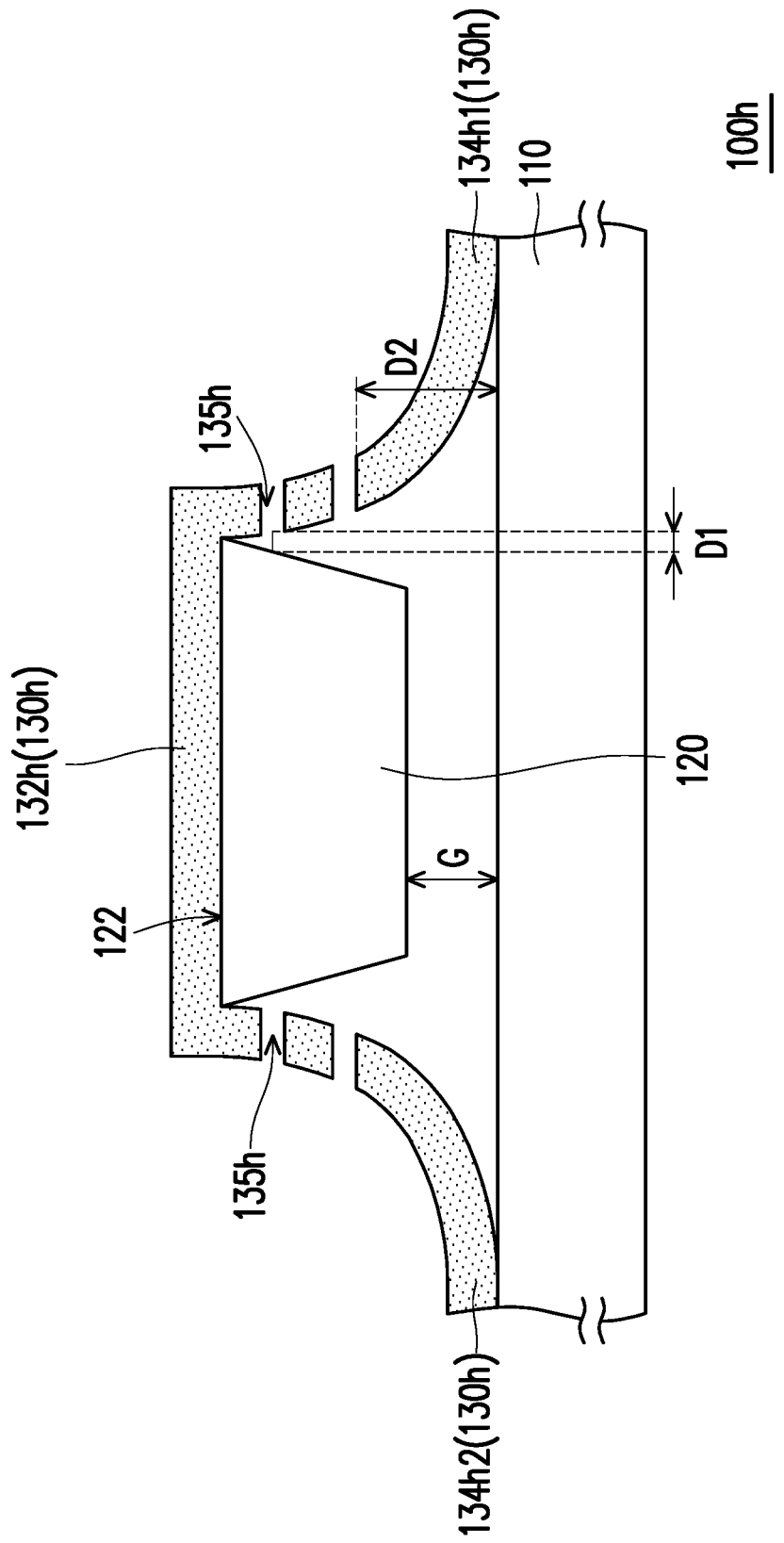
FIG. 8 is a schematic cross-sectional diagram of a micro component structure according to another embodiment of the invention.

FIG. 8 is a schematic cross-sectional diagram of a micro component structure according to another embodiment of the invention. Simultaneously referring to FIG. 1 and FIG. 8, a micro component structure 100h of the present embodiment is the same as the micro component structure 100a in FIG. 1, and the micro component 120a has a spacing G from the substrate 110. Here, an air spacing exists between the micro component 120a and the substrate 110 to adjust the transfer force for subsequent transfer. The difference between the micro component structure 100h of the present embodiment and the micro component structure 100a in FIG. 1 is as follows: a fixing structure 130h of the present embodiment includes a covering portion 132h and connecting portions 134h1 and 134h2, wherein the connecting portions 134h1 and 134h2 have patterned structures 135h (openings), and a shortest distance D1 between the patterned structure 135h closest to the micro component 120 and the micro component 120 is less than a shortest distance D2 between the patterned structure 135h and the substrate 110. Here, preferably, the shortest distance D1 is less than or equal to 1 micrometer. By virtue of the design, a breaking point may be close to a space between the connecting portions 134h1 and 134h2 and the covering portion 132h, thereby preventing the connecting portions 134h1 and 134h2 after transfer from remaining on the micro component 120, and increasing the yield of the micro component 120.

Figure 9A:
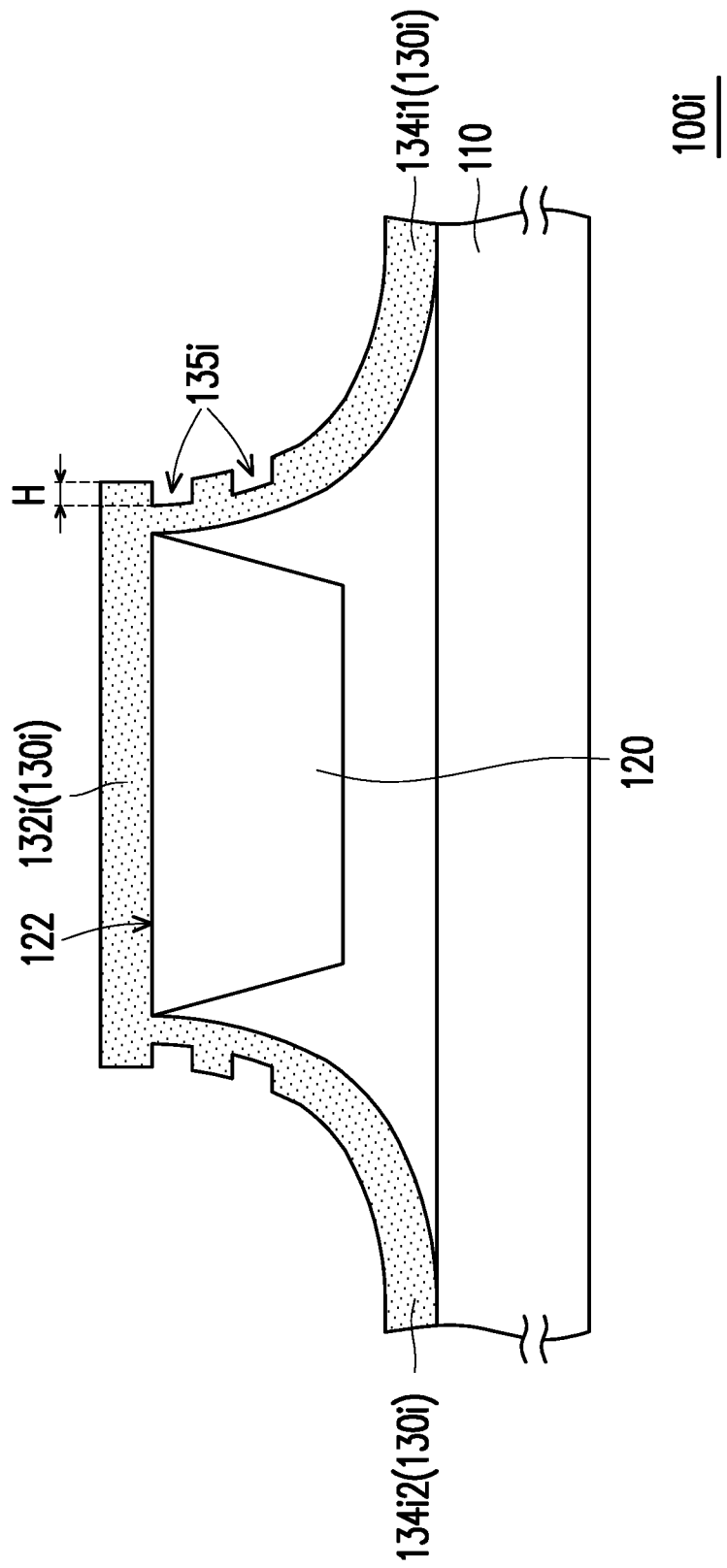
FIG. 9A is a schematic cross-sectional diagram of a micro component structure according to another embodiment of the invention.
Figure 9B:
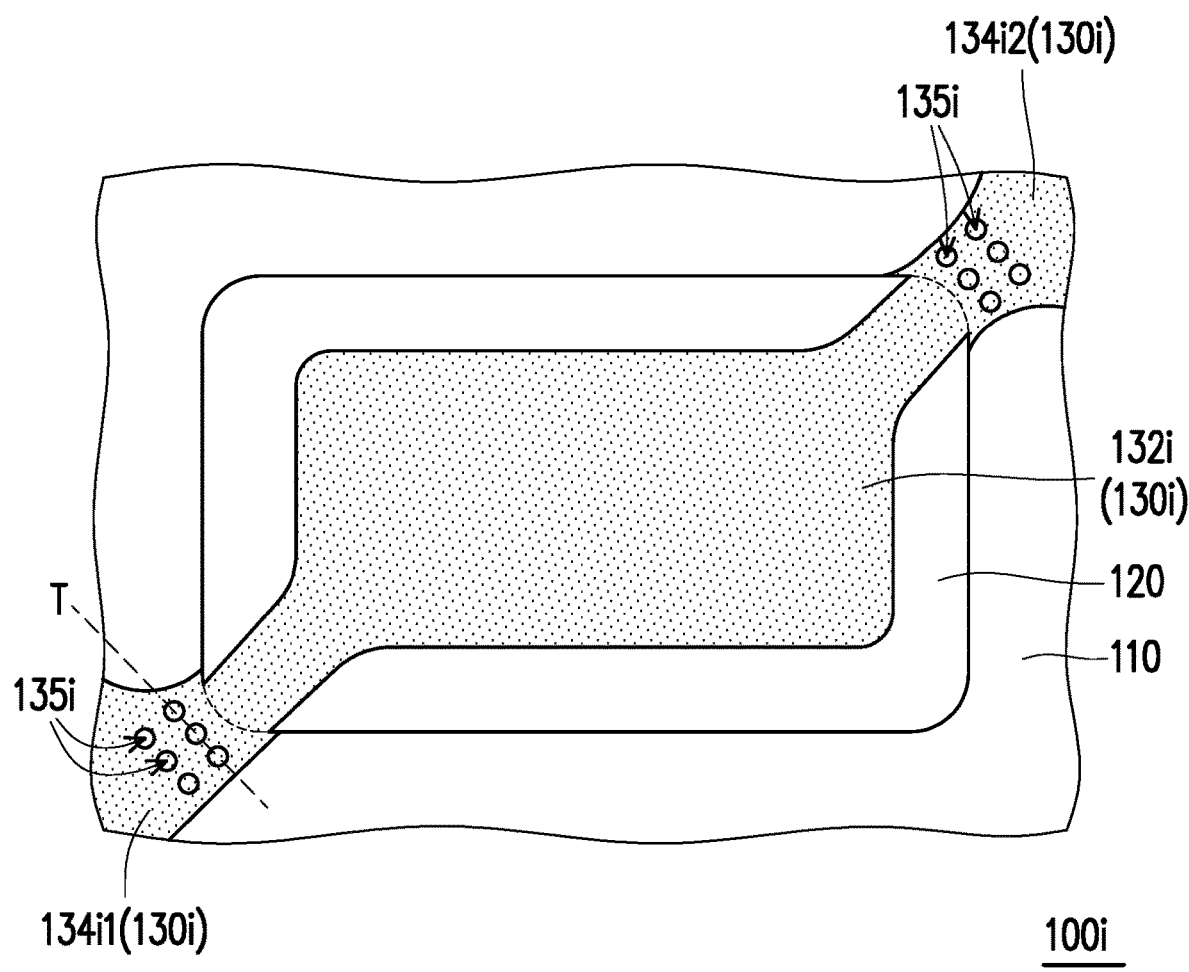
FIG. 9B is a schematic top diagram of the micro component structure in FIG. 9A.

FIG. 9A is a schematic cross-sectional diagram of a micro component structure according to another embodiment of the invention. FIG. 9B is a schematic top diagram of the micro component structure in FIG. 9A. Simultaneously referring to FIG. 1 and FIG. 9A, a micro component structure 100i of the present embodiment is similar to the micro component structure 100a in FIG. 1, and the difference between the micro component structure 100i and the micro component structure 100a is as follows: a fixing structure 130i of the present embodiment includes a covering portion 132i and connecting portions 134i1 and 134i2, wherein the connecting portions 134i1 and 134i2 include patterned structures 135i, and specifically, the patterned structures 135i are grooves which do not penetrate through the covering portion 132i. Here, a ratio of a depth D of a groove to a thickness H of the fixing structure 130i is greater than or equal to 0.2 and less than or equal to 0.8. If the ratio is less than 0.2, the support force of the connecting portions 134i1 and 134i2 is insufficient; and if the ratio is greater than 0.8, the connecting portions 134i1 and 134i2 are not easy to break. Furthermore, from a top view, referring to FIG. 9B, a width ratio of the patterned structures 135i (grooves) to the connecting portions 134i1 and 134i2 along a cutting line T is greater than or equal to 0.4 and less than or equal to 0.8. If the ratio is less than 0.4, the support force of the connecting portions 134i1 and 134i2 is insufficient; and if the ratio is greater than 0.8, the connecting portions 134i1 and 134i2 are not easy to break.

Figure 10:
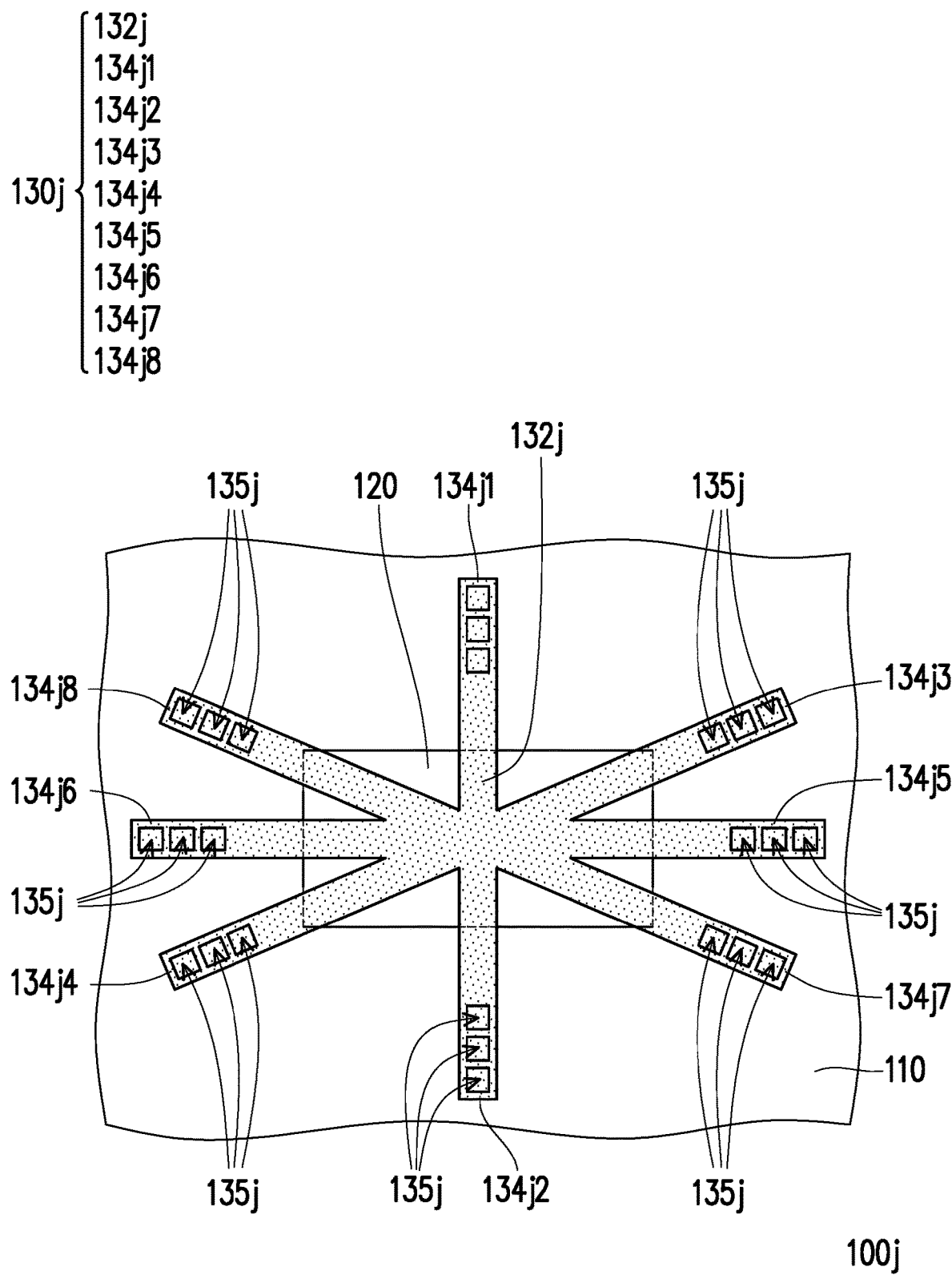
FIG. 10 is a schematic top diagram of a micro component structure according to another embodiment of the invention.

FIG. 10 is a schematic top diagram of a micro component structure according to another embodiment of the invention. Simultaneously referring to FIG. 10 and FIG. 9B, a micro component structure 100j of the present embodiment is similar to the micro component structure 100i in FIG. 9B, and the difference between the micro component structure 100j and the micro component structure 100i is as follows: a fixing structure 130j of the present embodiment includes a plurality of connecting portions 134j1, 134j2, 134j3, 134j4, 134j5, 134j6, 134j7 and 134j8. Two opposite sides of a covering portion 132j are respectively connected to the connecting portions 134j1, 134j2, 134j3, 134j4, 134j5, 134j6, 134j7 and 134j8, and the connecting portions 134j1, 134j2, 134j3, 134j4, 134j5, 134j6, 134j7 and 134j8 are dispersed from each other and are arranged symmetrically. In a unit area, ratios of areas of the connecting portions 134j1, 134j2, 134j3, 134j4, 134j5, 134j6, 134j7 and 134j8 occupied by the patterned structures 135j (grooves) to areas of the connecting portions 134j1, 134j2, 134j3, 134j4, 134j5, 134j6, 134j7 and 134j8 are the same. Therefore, when a connecting portion (such as the connecting portion 134j1) in the fixing structure 130j is abnormal in structure, the overall fixing structure 130j has a low support influence and is not easy to incline and scatter.

In conclusion, in a design of a micro component structure of the invention, at least one of a covering portion and connecting portions of a fixing structure includes patterned structures, wherein the patterned structures may include openings or grooves. If the connecting portions include the patterned structures, a breaking point falling position of the fixing structure may be controlled by means of the aperture sizes, numbers and arrangement modes of the patterned structures. If the covering portion includes the patterned structures, the fixing structure does not need to be aligned, thereby reducing the need for the alignment accuracy of the micro component structure. If both the covering portion and the connecting portions include the patterned structures, a bonding strength between the micro component and the fixing structure and a breaking point falling position of the fixing structure may be adjusted according to the patterned structures. In brief, by virtue of the layout of the patterned structures of the invention, the structural yield of the micro component structure may be improved.

Although the invention has been disclosed above by way of embodiments, it is not intended to limit the invention. It will be apparent to those skilled in the art that various modifications and variations can be made without departing from the spirit and scope of the invention. In view of the foregoing, the scope of protection of the invention will be defined by the scope of the appended claims.

What is claimed is:

1. A micro component structure, comprising:
   a substrate;
   at least one micro component disposed on the substrate, having a spacing from the substrate, and having at least one top surface; and
   a fixing structure disposed on the substrate and comprising at least one covering portion and at least one connecting portion, wherein the at least one covering portion is disposed on a portion of the at least one top surface of the at least one micro component, the at least one connecting portion is connected to an edge of the at least one covering portion and extends onto the substrate, and at least one of the at least one covering portion and the at least one connecting portion comprises at least one patterned structure,
   wherein the at least one patterned structure is at least one groove, and the at least one connecting portion comprises the at least one groove,
   wherein from a top view, a width ratio of the at least one groove to the connecting portion along a cutting line is greater than or equal to 0.2 and less than or equal to 0.8, and a ratio of an area of the at least one connecting portion occupied by the at least one groove to an area of the at least one connecting portion is greater than or equal to 0.2 and less than or equal to 0.8.

2. The micro component structure according to claim 1, wherein a ratio of a depth of the at least one groove to a thickness of the fixing structure is greater than or equal to 0.5 and less than 1.

3. The micro component structure according to claim 1, wherein an orthogonal projection of the at least one groove on the substrate is not overlapped with an orthogonal projection of the at least one micro component on the substrate.

4. The micro component structure according to claim 1, wherein the at least one connecting portion comprises a plurality of connecting portions, the at least one groove comprises a plurality of grooves, the at least one covering portion is connected to the connecting portions respectively, and the connecting portions are dispersed from each other and are arranged symmetrically.

5. The micro component structure according to claim 1, wherein the at least one micro component comprises a plurality of micro components, the fixing structure further comprises at least one contact portion, and the at least one contact portion is located among the micro components and is in direct contact with the substrate.

6. A micro component structure, comprising:
   a substrate;
   at least one micro component disposed on the substrate, having a spacing from the substrate, and having at least one top surface; and
   a fixing structure disposed on the substrate and comprising at least one covering portion and at least one connecting portion, wherein the at least one covering portion is disposed on a portion of the at least one top surface of the at least one micro component, the at least one connecting portion is connected to an edge of the at least one covering portion and extends onto the substrate, and at least one of the covering portion and the at least one connecting portion comprises at least one patterned structure,
   wherein the at least one covering portion comprises a plurality of covering portions, the at least one top surface comprises a plurality of top surfaces, the covering portions are located on the top surfaces respectively, the at least one patterned structure comprises a plurality of openings, the at least one connecting portion is connected to the covering portions and comprises the openings, and a ratio of an area of the at least one connecting portion occupied by the openings over a total area of the at least one connecting portion is greater than or equal to 0.8 and less than 1.

7. The micro component structure according to claim 6, wherein a ratio of an orthogonal projection area of each of the covering portions on each of the top surfaces of the corresponding micro component to an area of each of the top surfaces of the corresponding micro component is greater than or equal to 0.5 and less than or equal to 1.

8. The micro component structure according to claim 6, wherein the covering portions and the at least one connecting portion comprise the openings, and a ratio of an area of each of the covering portions occupied by the openings to an area of each of the covering portions is greater than or equal to 0.8 and less than 1.

\* \* \* \* \*